United States Patent
Huang et al.

(10) Patent No.: US 6,949,472 B1
(45) Date of Patent: Sep. 27, 2005

(54) METHOD FOR HIGH KINETIC ENERGY PLASMA BARRIER DEPOSITION

(75) Inventors: Cheng-Lin Huang, Hsinchu (TW); Ching-Hua Hsieh, Hsinchu (TW); Shau-Lin Shue, Hsinchu (TW)

(73) Assignee: Taiwan Semiconductor Manufacturing Co., LTD, Hsin Chu (TW)

( * ) Notice: Subject to any disclaimer, the term of this patent is extended or adjusted under 35 U.S.C. 154(b) by 0 days.

(21) Appl. No.: 10/838,720

(22) Filed: May 3, 2004

(51) Int. Cl.[7] ............................................. H01L 21/31
(52) U.S. Cl. ..................... 438/758; 438/694; 438/689; 438/643; 438/627; 438/653; 438/618
(58) Field of Search ............................. 438/758, 694, 438/689, 643, 627, 653, 618

(56) References Cited

U.S. PATENT DOCUMENTS

| | | | |
|---|---|---|---|
| 6,333,255 B1 * | 12/2001 | Sekiguchi | 438/622 |
| 6,797,642 B1 * | 9/2004 | Chu et al. | 438/758 |
| 2002/0090822 A1 * | 7/2002 | Jiang et al. | 438/694 |
| 2003/0129827 A1 * | 7/2003 | Lee et al. | 438/629 |
| 2004/0067308 A1 * | 4/2004 | Zheng et al. | 427/249.15 |

* cited by examiner

Primary Examiner—W. David Coleman
Assistant Examiner—Victor V. Yevsikov
(74) Attorney, Agent, or Firm—Tung & Associates

(57) ABSTRACT

A novel method for depositing a barrier layer on a single damascene, dual damascene or other contact opening structure. The method eliminates the need for pre-cleaning argon ion bombardment of the structure, thereby reducing or eliminating damage to the surface of the underlying conductive layer and sputtering of copper particles to the via or other contact opening sidewall. The process includes fabrication of a single damascene, dual damascene or other contact opening structure on a substrate; optionally pre-cleaning the structure typically using nitrogen or hydrogen plasma; depositing a thin metal barrier layer on the sidewalls and bottom of the structure; and redistributing or re-sputtering the barrier layer on the bottom and sidewalls of the structure.

20 Claims, 2 Drawing Sheets

METHOD FOR HIGH KINETIC ENERGY PLASMA BARRIER DEPOSITION

FIELD OF THE INVENTION

The present invention relates to processes for the back-end-of-line (BEOL) cleaning of via sidewalls and bottoms in damascene structures. More particularly, the present invention relates to a novel, high kinetic energy plasma method for the deposition of barrier layers in damascene structures which eliminates the need for argon ion bombardment pre-cleaning (or reactive pre-clean by forming gas (ex:N2/H2)) of via sidewalls and bottoms.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner. The various layers define circuit components or devices such as transistors.

After the individual devices have been fabricated on the substrate, they must be connected together to perform the desired circuit functions. This interconnection process is generally known as "metallization" and is performed using a number of different photolithographic, deposition, and removal techniques. In one interconnection process, called a "dual damascene" technique, two interconnect channels of conductor materials are separated by interlayer dielectric layers in vertically separated planes perpendicular to each other and interconnected by a vertical connection, or "via", at their closest point.

While there exist many variations of a dual-damascene process flow, the process typically begins with deposition of a silicon dioxide dielectric layer of desired thickness which corresponds to the thickness for the via or vias to be etched in the dielectric layer. Next, a thin etch stop layer, typically silicon nitride, is deposited on the dielectric layer. Photolithography is then used to pattern via openings over the etch stop layer, after which dry etching is used to etch via openings in the etch stop layer. The patterned photoresist is then stripped from the etch stop layer after completion of the etch. A remaining dielectric layer the thickness of which corresponds to the thickness of the trench for the metal interconnect lines is then deposited on the etch stop layer, and photolithography followed by dry etching is used to pattern the trenches in the remaining dielectric layer and the vias beneath the trenches. The trench etching stops at the etch stop layer, while the vias are etched in the first dielectric layer through the openings in the etch stop layer and beneath the trenches. Next, a barrier material of Ta or TaN is deposited on the sidewalls and bottoms of the trenches and vias using ionized PVD. A uniform copper seed layer is then deposited on the barrier layer using CVD. After the trenches and vias are filled with copper in a single copper inlay step, the copper overburden extending from the trenches is removed and the upper surfaces of the metal lines planarized using CMP. In the dual damascene process described above, the vias and the trenches are etched in the same step, and the etch stop layer defines the bottom of the trenches. In other variations, the trench is patterned and etched after the via. In the single damascene process, the vias and trenches are individually, rather than simultaneously, filled with copper inlays.

A significant advantage of the dual-damascene process is the creation of a two-leveled metal inlay which includes both via holes and metal line trenches that undergo copper fill at the same time. This eliminates the requirement of forming the trenches for the metal interconnect lines and the holes for the vias in separate processing steps. The process further eliminates the interface between the vias and the metal lines.

Another important advantage of the dual-damascene process is that completion of the process typically requires 20% to 30% fewer steps than the traditional aluminum metal interconnect process. Furthermore, the dual damascene process omits some of the more difficult steps of traditional aluminum metallization, including aluminum etch and many of the tungsten and dielectric CMP steps. Reducing the number of process steps required for semiconductor fabrication significantly improves the yield of the fabrication process, since fewer process steps translate into fewer sources of error that reduce yield.

In both the single damascene and dual damascene techniques, the via sidewalls and via bottom are typically subjected to a reactive clean and physical argon ion bombardment process prior to deposition of the barrier layer onto those surfaces. This is illustrated in FIG. 1A, in which a dual damascene structure 10 is subjected to argon ion bombardment prior to deposition of a barrier layer (not shown) on the structure 10. The dual damascene structure 10 includes a typically copper conductive layer 20, on which is sequentially deposited a via dielectric layer 22 and a trench dielectric layer 24. A via opening 26 and a trench opening 28 are etched in the via dielectric layer 22 and the trench dielectric layer 24, respectively. During the argon ion bombardment cleaning process, argon ions 18 are directed against the trench sidewalls 12, the via sidewalls 14 and the via bottom 16 of the structure 10. However, as shown in FIG. 1B, the argon ion bombardment process has a tendency to cause re-sputtering of metal particles 21 from the conductive layer 20 at the via bottom 16, onto the via sidewalls 14. This disrupts the structural integrity of the damascene profile, adversely affecting device reliability and performance. Accordingly, a method is needed which is suitable for eliminating the requirement for argon ion bombardment cleaning of the via bottom and sidewalls prior to deposition of the barrier layer and seed layer onto those surfaces.

An object of the present invention is to provide a novel method which is suitable for eliminating the need of pre-cleaning a contact opening structure prior to depositing a barrier layer on the structure.

Another object of the present invention is to provide a novel method which is suitable for single damascene, dual damascene and other processes for the fabrication of electrical contacts between conductive layers on a substrate.

Still another object of the present invention is to provide a novel, high kinetic energy method suitable for the deposition of a barrier layer on a contact opening structure.

Yet another object of the present invention is to provide a novel method which is suitable for preventing damage to a copper or other conductive layer beneath a contact opening structure by eliminating the need for pre-clean argon ion bombardment of the conductive layer prior to the formation of a barrier layer in a via, trench or other contact opening opening above the conductive layer.

Another object of the present invention is to provide a novel method which is suitable for preventing sputtering of copper or other metal from a conductive layer beneath a contact opening structure by eliminating the need for pre-clean argon ion bombardment of the conductive layer prior to the formation of a barrier layer in a via, trench or other contact opening opening above the conductive layer.

A still further object of the present invention is to provide a novel method which is capable of improving Rc distribution and reducing the Rc mean value of IC devices on a substrate. In this object of the present invention is to provide a novel method which is capable of improving Rc distribution and reducing the Rc mean value by more re-sputter amount to achieve punch through via bottom (in-situ remove via bottom barrier.

Still another object of the present invention is to provide a novel method which is capable of improving the EM (electro-migration) characteristics of a damascene or other contact opening structure.

SUMMARY OF THE INVENTION

In accordance with these and other objects and advantages, the present invention is generally directed to a novel method for depositing a barrier layer on a single damascene, dual damascene or other contact opening structure. The method eliminates the need for pre-cleaning argon ion bombardment of the structure, thereby reducing or eliminating damage to the surface of the underlying conductive layer and sputtering of copper particles to the via or other contact opening sidewall. The process includes fabrication of a single damascene, dual damascene or other contact opening structure on a substrate; optionally pre-cleaning the structure typically using nitrogen or hydrogen plasma; depositing a thin metal barrier layer on the sidewalls and bottom of the structure; and re-distributing or re-sputtering the barrier layer on the bottom and sidewalls of the structure.

In a typical embodiment, the metal barrier layer is deposited on the bottom and sidewalls of the contact opening structure using a high kinetic energy plasma deposition process. The barrier metal is applied to the bottom and sidewalls at an input power of typically about 1 watts to about 800 watts per square inch of area on the target metal to produce a barrier layer having a thickness of typically about 1–600 A. Metals suitable for the barrier layer include Ti, TiN, Ta or TaN, for example.

BRIEF DESCRIPTION OF THE DRAWINGS

The invention will be better understood, by way of example, with reference to the accompanying drawings, in which.

DESCRIPTION OF THE PREFERRED EMBODIMENTS

The present invention has particularly beneficial utility in the deposition of a barrier layer in via and trench openings during the formation of a dual damascene structure on a semiconductor wafer substrate. However, the invention is not so limited in application, and while references may be made to such dual damascene structure, the invention is more generally applicable to deposition of barrier layers in via and trench openings during the formation of single damascene or other contact opening structures during the fabrication of semiconductor integrated circuits.

Figure 1A:
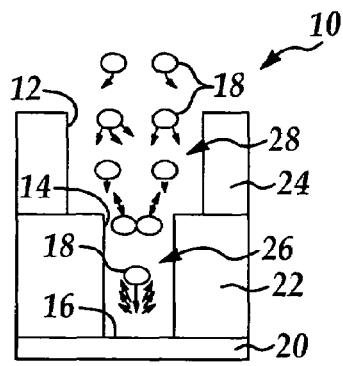
FIG. 1A is a cross-sectional view of a conventional damascene structure, illustrating conventional pre-cleaning argon ion bombardment of the bottom and sidewalls of the structure prior to deposition of a barrier layer thereon.
Figure 1B:
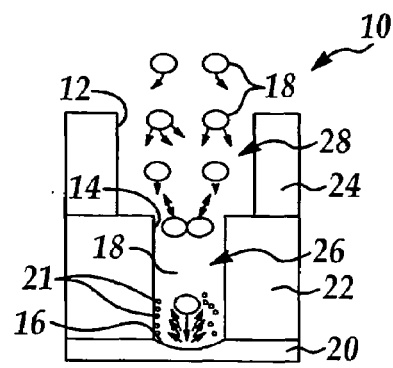
FIG. 1B is a cross-sectional view of the damascene structure of FIG. 1A, illustrating damage to the underlying conductive layer and sputtering of metal particles to the sidewalls of the structure as a result of conventional pre-cleaning argon ion bombardment.
Figure 2A:
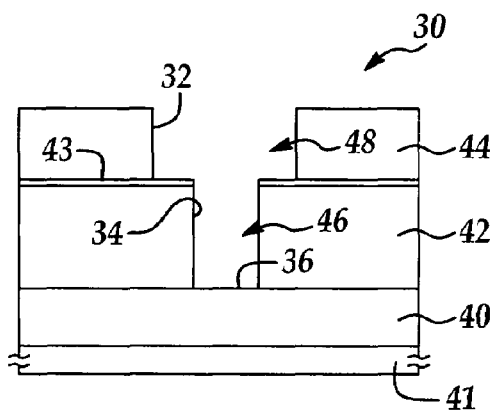
FIG. 2A is a cross-sectional view of a damascene structure in implementation of the method of the present invention.
Figure 2B:
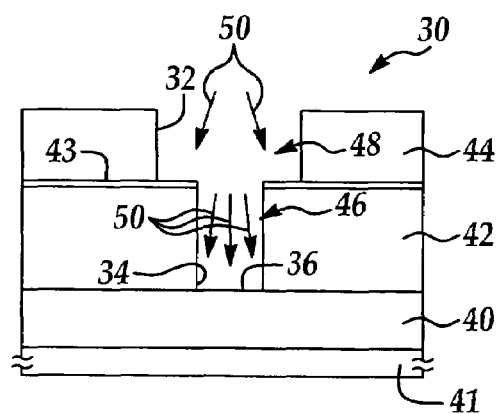
FIG. 2B is a cross-sectional view of the damascene structure, illustrating an optional nitrogen or helium reactive plasma pre-clean step in implementation of the process of the present invention.
Figure 2C:
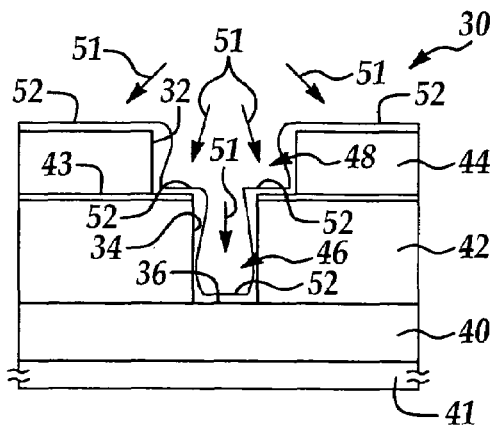
FIG. 2C is a cross-sectional view of the damascene structure, illustrating deposition of a metal barrier layer on the sidewalls and bottom of a via opening and trench opening in the structure according to the invention.
Figure 2D:
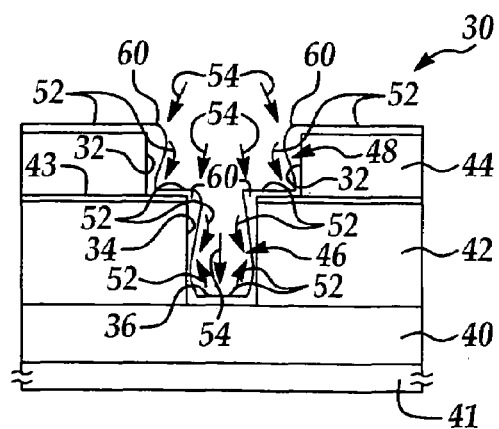
FIG. 2D is a cross-sectional view of the damascene structure, illustrating re-distribution or re-sputtering of the metal barrier layer deposited on the structure in the step of FIG. 2C.
Figure 2E:
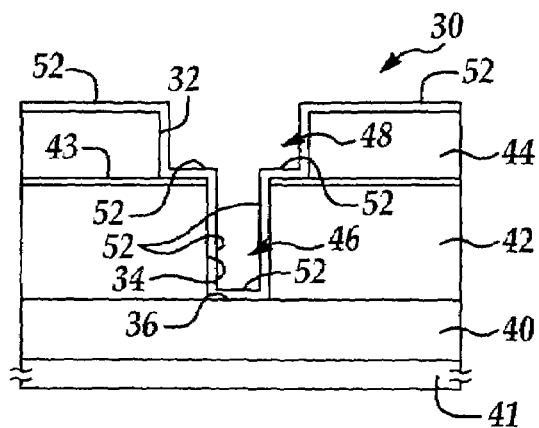
FIG. 2E is a cross-sectional view of the damascene structure, after re-distribution or re-sputtering of the metal barrier layer according to the step of FIG. 2D.
Figure 2F:
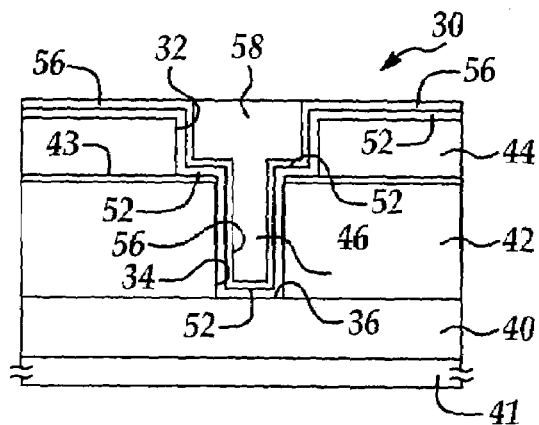
FIG. 2F is a cross-sectional view of the damascene structure, illustrating deposition of a seed layer on the barrier layer after the step of FIG. 2E and inlay of copper in the trench and via of the structure after deposition of the seed layer to complete fabrication of the damascene structure.
Figure 3:
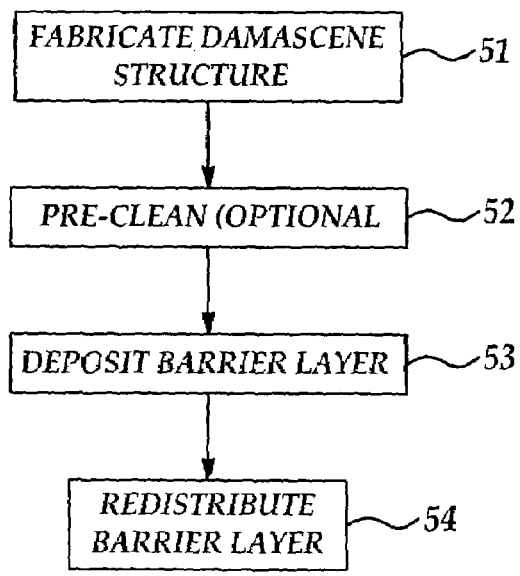
FIG. 3 is a flow diagram which summarizes a typical process flow in accordance with the method of the present invention.

Shown throughout FIGS. 2A–3 of the drawings, the present invention is generally directed to a novel method for the deposition of a metal barrier layer on the trench sidewalls, via sidewalls and via bottom of a single damascene, dual damascene or other contact opening structure. The method eliminates the need for barrier pre-deposition argon ion bombardment of those surfaces, thereby reducing or eliminating damage to the surface of the conductive layer underlying the structure and sputtering of metal particles from the conductive layer onto the contact opening sidewalls. The process includes initial fabrication of the single damascene, dual damascene or other contact opening structure on a substrate. The structure may then optionally be pre-cleaned typically using a nitrogen or hydrogen plasma. Next, a thin metal barrier layer, which may be Ti, TiN, Ta or TaN, for example, is deposited on the sidewalls of the trench and on the sidewalls and bottom of the via in the structure. The metal barrier layer is then typically re-distributed on the surfaces of the structure typically using argon ion bombardment and/or etching.

In a typical embodiment, the metal barrier layer is deposited on the bottom and sidewalls of the contact opening structure using high kinetic energy plasma deposition. In such a process, the substrate is placed in a deposition chamber and positive argon or other ions are generated in a plasma under high vacuum and accelerated toward a target material which is the same metal as the barrier metal to be deposited on the structure. During acceleration, the positive ions gain momentum and strike the target, and physically dislodge, or sputter, metal atoms from the target. The dislodged or sputtered metal atoms migrate to the structure, where the atoms condense and form a thin film on the trench and via sidewalls, as well as the bottom of the via. Excess material is removed from the chamber using a vacuum pump. According to the method of the present invention, the barrier metal is applied to the surfaces of the structure at an input power of typically about 80–800 watts per square inch of area on the metal target. A barrier layer having a thickness of typically from about 200 to about 400 is deposited on the trench sidewalls, the via sidewalls and the via bottom.

Referring initially to FIG. 2A, a cross-section of a dual damascene structure in implementation of the present invention is generally indicated by reference numeral 30. Briefly, the dual damascene structure 30 includes a typically copper conductive layer 40 which is deposited on a wafer substrate 41 typically using conventional deposition processes known by those skilled in the art. While there exist many variations of the dual damascene process, the process typically begins with deposition of a via dielectric layer 42 of desired thickness which corresponds to the thickness of a via opening 46 to be etched in the via dielectric layer 42. Next, a thin etch stop layer 43, typically silicon nitride, is deposited on the via dielectric layer 42. Conventional photolithography techniques are then used to deposit and pattern a photoresist layer (not shown) on the etch stop layer 43, after which the via opening 46 is etched through the etch stop layer 43 and via dielectric layer 42, to the upper surface of the conductive layer 40. After completion of the etch, the patterned photoresist is then stripped from the etch stop layer 43.

A trench dielectric layer 44, the thickness of which corresponds to the thickness of a trench opening 48 to be etched therein, is then deposited on the etch stop layer 43. Photolithography, followed by dry etching, is used to pattern the trench openings 48 in the trench dielectric layer 44. The trench etching stops at the etch stop layer 43, while the via opening 46 extends through the via dielectric layer 42 beneath the trench opening 48. The patterned photoresist for the trench opening 48 is then stripped from the trench dielectric layer 44. Accordingly, the via opening 46 includes vertical via sidewalls 34 and a via bottom 36 which corresponds to the upper surface of the conductive layer 40. The trench opening 48 directly overlies the via opening 46 and includes vertical trench sidewalls 32.

As shown in FIG. 2B, in accordance with the present invention a reactive plasma 50 may then be used to clean and remove particles from the trench sidewalls 32, the via sidewalls 34 and the via bottom 36. The reactive plasma 50 may be a nitrogen plasma or a hydrogen plasma. It is understood that the reactive plasma cleaning process of FIG. 2B is optional and may be omitted for purposes of the present invention.

Referring next to FIG. 2C, a barrier metal 51 is next deposited on the trench sidewalls 32, the via sidewalls 34 and the via bottom 36, typically using a high kinetic energy plasma deposition process, to define a metal barrier layer 52 on those surfaces. In a preferred embodiment, the barrier metal 51 is applied to the surfaces at an input power of typically from about 80 to about 800 watts/square inch of target area for a time period of typically about 1 to 300 seconds. This results in a continuous barrier layer 52 which extends along the trench sidewalls 32, the via sidewalls 34, and the via bottom 36 and has a thickness of typically from about 10 A to about 600 A.

As shown in FIG. 2D, application of the barrier metal 51 to the structure 30, as heretofore described with respect to FIG. 2C, results in deposition of a barrier layer 52 having a variable thickness. Specifically, an overhang 60 is typically formed in the barrier layer 52 at the upper portion of either or both of the via sidewalls 34 and the trench sidewalls 32. Moreover, the barrier layer 52 at the lower portion of either or both of the trench sidewalls 32 and via sidewalls 34 is excessively thin with respect to the barrier layer 52 at the upper portion of the trench sidewalls 32 and via sidewalls 34. The thickness of the barrier layer 52 must be more uniform for optimum deposition of a seed layer on the barrier layer 52 in a subsequent processing step. Accordingly, in a re-distribution or re-sputtering step, shown in FIG. 2D, each overhang 60 is subjected to bombardment by argon plasma 54 to re-distribute some of the barrier layer material 52 from the overhang 60 to the underlying trench sidewall 32 and via sidewall 34 to increase sidewall coverage with the barrier layer 52. The portion of the barrier layer 52 at the via bottom 36 may also be subjected to argon ion bombardment, to thin the barrier layer 52 and redistribute some of the barrier layer material 52 from the via bottom 36 and onto the via sidewalls 34. The overhangs 60 may be further reduced in size by etching, as deemed necessary. As a result of the re-distribution or re-sputtering process, as shown in FIG. 2E, the thickness of the barrier layer 52 along the trench sidewalls 32, the via sidewalls 34 and the via bottom 36 is substantially uniform and is typically from about 10 A to about 600 A.

As shown in FIG. 2F, after argon ion bombardment and/or etching of the barrier layer 52 as heretofore described with respect to FIG. 2E, a typically copper seed layer 56 is deposited on the barrier layer 52. The via opening 46 and the trench opening 48 are then filled with a copper inlay 58, according to the knowledge of those skilled in the art. The copper inlay 58 is typically subjected to chemical mechanical planarization (CMP) to planarize or smooth the upper surface of the copper inlay 58 and complete fabrication of the damascene structure 30.

A typical process flow for the process of the present invention is summarized in FIG. 3. In process step S1, a single damascene, dual damascene or other contact opening structure is fabricated on a substrate. In process step S2, the trench sidewalls, via sidewalls and via bottom of the structure are optionally subjected to a reactive plasma cleaning process typically using reactive nitrogen or hydrogen plasma. In process step S3, a metal barrier layer is deposited on the trench sidewalls, via sidewalls and via bottom. In process step S4, the barrier layer is re-distributed or re-sputtered using argon ion bombardment and/or etching to reduce or eliminate overhang and increase sidewall coverage of the barrier layer material. Process step S4 is followed by deposition of a seed layer on the barrier layer, infill of a metal inlay in the via opening and trench opening, and planarization of the metal inlay, to complete fabrication of the structure.

While the preferred embodiments of the invention have been described above, it will be recognized and understood that various modifications can be made in the invention and the appended claims are intended to cover all such modifications which may fall within the spirit and scope of the invention.

What is claimed is:

1. A method of depositing a barrier layer to improve barrier layer thickness uniformity in an interconnect opening, comprising the steps of:
   providing a substrate comprising a dielectric layer;
   forming a structure comprising an interconnect opening in said dielectric layer;
   initially forming a barrier layer to line said interconnect opening; and,
   re-distributing said barrier layer according to a sputter-redistribution process to increase said barrier layer thickness and thickness uniformity along said interconnect opening sidewalls.

2. The method of claim 1 further comprising the step of pre-cleaning said structure by subjecting said structure to a reactive plasma prior to the step of initially forming a barrier layer.

3. The method of claim 2, wherein said reactive plasma is formed from a plasma source gas selected from the group consisting of hydrogen ($H_2$) and nitrogen ($N_2$).

4. The method of claim 1 wherein said barrier layer has a substantially uniform thickness along said sidewalls of from about 10 angstroms to about 600 angstroms following the step of redistributing.

5. The method of claim 1 wherein said structure is a dual damascene structure.

6. The method of claim 1 wherein said barrier metal layer is initially formed by a high kinetic energy plasma sputter deposition process at an input power of at least about 80 watts per square inch of sputter target area.

7. The method of claim 1 wherein said barrier layer is initially formed having a non-uniform thickness along said sidewalls.

8. The method of claim 1, wherein said interconnect opening exposes a conductive portion at a bottom portion of said interconnect opening prior to the step of forming a barrier layer.

9. The method of claim 1, wherein following the step of redistributing, a thinned portion of said barrier layer remains covering a bottom portion of said interconnect opening.

10. The method of claim 1, further comprising the steps of:
    forming a metal seed layer on the barrier layer following the step of redistributing; and,
    filling the interconnect opening with copper.

11. The method of claim 1, wherein the sputter-redistribution process comprises argon plasma bombardment.

12. The method of claim 1, wherein said barrier layer comprises a material selected from the group consisting of Ti, TiN, Ta, and TaN.

13. A method of forming a barrier layer to improve barrier layer thickness uniformity comprising the steps of:
    providing a substrate comprising a dielectric layer overlying a conductive layer;
    forming a structure comprising an interconnect opening in said dielectric layer to expose said conductive layer at a bottom portion of said interconnect opening;
    forming a barrier layer to line said interconnect opening, said barrier layer comprising a non-uniform thickness along sidewall portions; and,
    re-distributing said barrier layer according to a sputter-redistribution process to increase said barrier layer thickness and thickness uniformity along said interconnect opening sidewalls.

14. The method of claim 13 further comprising the step of pre-cleaning said structure by subjecting said structure to a reactive plasma prior to the step of forming a barrier layer.

15. The method of claim 13 wherein said barrier layer has a substantially uniform thickness along said sidewall portions following the step of redistributing.

16. The method of claim 13 wherein said structure is a dual damascene structure.

17. A method of depositing a barrier layer to improve metal seed layer formation comprising the steps of:
    providing a substrate comprising a dielectric layer overlying a conductive layer;
    forming a structure comprising an interconnect opening in said dielectric layer to expose said conductive layer at a bottom portion of said interconnect opening;
    forming a barrier layer to line said interconnect opening, said barrier layer comprising a non-uniform thickness along sidewall portions;
    re-distributing said barrier layer according to a sputter-redistribution process to increase said barrier layer thickness and thickness uniformity along said interconnect opening sidewalls while leaving a portion of said barrier layer covering said bottom portion; and,
    then forming a metal seed layer on said barrier layer.

18. The method of claim 17 further comprising the step of pre-cleaning said interconnect opening by subjecting said structure to a reactive plasma prior to the step of forming a barrier layer.

19. The method of claim 17 wherein said barrier layer has a substantially uniform thickness along said sidewall portions and said bottom portion of from about 10 angstroms to about 600 angstroms following the step of redistributing.

20. The method of claim 17 wherein said structure is selected from the group consisting of a single damascene and a dual damascene structure.

* * * * *